(12) United States Patent
Chen et al.

(10) Patent No.: US 9,847,307 B1
(45) Date of Patent: Dec. 19, 2017

(54) TWO-END DRIVING, HIGH-FREQUENCY SUB-SUBSTRATE STRUCTURE AND HIGH-FREQUENCY TRANSMISSION STRUCTURE INCLUDING THE SAME

(71) Applicant: LuxNet Corporation, Jhongli, Taoyuan County (TW)

(72) Inventors: Ho-I Chen, Jhongli (TW); Po-Chao Huang, Jhongli (TW); Yi-Ching Chiu, Jhongli (TW); Pi-Cheng Law, Jhongli (TW); Hua-Hsin Su, Jhongli (TW)

(73) Assignee: Luxnet Corporation, Zhongli, Taoyuan County (TW)

( * ) Notice: Subject to any disclaimer, the term of this patent is extended or adjusted under 35 U.S.C. 154(b) by 0 days.

(21) Appl. No.: 15/459,523

(22) Filed: Mar. 15, 2017

(30) Foreign Application Priority Data

Nov. 16, 2016 (TW) .............................. 105217484 U

(51) Int. Cl.
*H01L 23/66* (2006.01)
*H01L 23/498* (2006.01)
(Continued)

(52) U.S. Cl.
CPC .......... *H01L 23/66* (2013.01); *H01L 23/3731* (2013.01); *H01L 23/4985* (2013.01); *H01L 23/49827* (2013.01); *H01L 23/49838* (2013.01); *H01L 24/45* (2013.01); *H01L 24/48* (2013.01); *H01P 3/081* (2013.01); *H01L 2223/6611* (2013.01); *H01L 2223/6616* (2013.01); *H01L 2223/6627* (2013.01);
(Continued)

(58) Field of Classification Search
CPC .......... H01L 23/50; H01L 23/52; H01L 23/66
See application file for complete search history.

(56) References Cited

U.S. PATENT DOCUMENTS 7,405,477 B1 * 7/2008 Tao ........................ H01L 23/552
257/659
9,117,835 B2 * 8/2015 Ammar ................. H01L 23/552
(Continued)

*Primary Examiner* — Cuong Q Nguyen
(74) *Attorney, Agent, or Firm* — Muncy, Geissler, Olds & Lowe, P.C.

(57) ABSTRACT

The present invention relates to a two-end driving, high-frequency sub-substrate structure, comprising a sub-substrate body, wherein: the sub-substrate body has an upper side provided with a first signal pad area and a second signal pad area, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two grounding pad areas provided respectively on two lateral sides of the first signal pad area and the second signal pad area and constituting a portion of a coplanar waveguide, the sub-substrate body has an inner layer or bottom side that is provided with a grounding layer or combined with a grounding layer.

20 Claims, 16 Drawing Sheets

(51) Int. Cl.
*H01L 23/00* (2006.01)
*H01L 23/373* (2006.01)
*H01P 3/08* (2006.01)
*H04B 10/80* (2013.01)

(52) U.S. Cl.
CPC .............. *H01L 2223/6638* (2013.01); *H01L 2224/45014* (2013.01); *H01L 2224/45144* (2013.01); *H01L 2224/48227* (2013.01); *H04B 10/801* (2013.01)

(56) References Cited

U.S. PATENT DOCUMENTS

2016/0379944 A1\* 12/2016 Zampardi, Jr. ... H01L 29/66242
257/197
2017/0162525 A1\* 6/2017 Takagi .................... H01L 23/66

\* cited by examiner

TWO-END DRIVING, HIGH-FREQUENCY SUB-SUBSTRATE STRUCTURE AND HIGH-FREQUENCY TRANSMISSION STRUCTURE INCLUDING THE SAME

BACKGROUND OF THE INVENTION

1. Technical Field

The present invention relates to a high-frequency circuit for optical communication and more particularly to a two-end driving, high-frequency sub-substrate structure and a high-frequency transmission structure including the same.

2. Description of Related Art

In the field of optical communication, higher and higher data transmission speed is desired, and yet issues facing high-speed signal transmission have been different from those in the past. To transmit signals at high speed, it is often required to consider the integrity of high-speed signals during transmission, and when designing a high-frequency circuit, measures for reducing signal attenuation must be taken to ensure the matching of characteristic impedance. An impedance-matching design, therefore, entails proper adjustment in wire width and wire spacing and the provision of well-structured through holes. The industry has made great efforts in devising a suitable high-frequency package architecture that meets the requirements of high-frequency circuits in high-speed networks.

As far as optical communication circuits are concerned, microstrips are typically used in the circuit layout of a sub-substrate or circuit board. Generally, a microstrip sub-substrate includes a set of signal pad areas. A semiconductor chip is placed on one of the signal pad areas while a wire bond is formed between the semiconductor chip and another signal pad area in order to drive the semiconductor chip. When transmitting a high-frequency signal, however, the microstrip design tends to result in a subtle interaction between the microstrips carrying the high-frequency signal and the surrounding medium, giving rise to a parasitic capacitance/inductance effect, which not only compromises signal continuity but also leads to recurrent signal distortion.

BRIEF SUMMARY OF THE INVENTION

The primary objective of the present invention is to provide a sub-substrate structure and high-frequency transmission structure that have outstanding high-frequency transmission properties.

To obtain the aforementioned object, the present invention provides a two-end driving, high-frequency sub-substrate structure, comprising a sub-substrate body, wherein: the sub-substrate body has an upper side provided with a first signal pad area and a second signal pad area, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two grounding pad areas provided respectively on two lateral sides of the first signal pad area and the second signal pad area and constituting a portion of a coplanar waveguide, the sub-substrate body has an inner layer or bottom side that is provided with a grounding layer or combined with a grounding layer.

Further, each of the grounding pad areas is formed with at least one via hole extending through the sub-substrate body in order for the via holes to electrically connect the grounding pad areas and the grounding layer.

Another object of the present invention is to provide a two-end driving, high-frequency sub-substrate structure, comprising a sub-substrate body, wherein: the sub-substrate body has an upper side provided with a first signal pad area and a second signal pad area, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two grounding pad areas provided respectively on two lateral sides of the first signal pad area and the second signal pad area and constituting a portion of a coplanar waveguide, the sub-substrate body has an inner layer or bottom side provided with a grounding layer or combined with a grounding layer.

Further, the sub-substrate body is a ceramic heat-dissipating substrate.

Further, the sub-substrate body is aluminum nitride (AlN) or alumina ($Al_2O_3$).

Further, the jumper wire is a gold wire ribbon or a gold wire.

Another object of the present invention is to provide a two-end driving, high-frequency transmission structure, comprising: a main substrate, a sub-substrate provided on the main substrate, and a circuit board. The sub-substrate has a sub-substrate body, the sub-substrate body has an upper side provided with a first signal pad area and a second signal pad area, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two first grounding pad area provided for the two lateral sides of the first signal pad area and the second signal pad area and constituting a portion of a coplanar waveguide, the sub-substrate body has an inner layer or bottom side that is provided with a first grounding layer or combined with a grounding layer. The circuit board has two lateral portions provided respectively with a first metal pad area and a second metal pad area, there are two second grounding pad areas provided respectively on two lateral sides of each of the first metal pad area and the second metal pad area and constituting a portion of a coplanar waveguide, the circuit board has an inner layer or bottom side provided with a second grounding layer, each of the second grounding pad area is formed with at least one via hole extending through the circuit board in order for the via holes to electrically connect the second grounding pad areas and the second grounding layer, the first metal pad area is connected to the first signal pad area by an electrical connection means, the second metal pad area is connected to the second signal pad area by an electrical connection means.

Further, the first grounding pad areas is formed with at least one via hole extending through the sub-substrate body in order for the via holes to electrically connect the first grounding pad areas and the first grounding layer.

Another object of the present invention is to provide a two-end driving, high-frequency transmission structure, comprising: a main substrate provided on with a grounding layer, a sub-substrate provided on the main substrate, and a circuit board provided on the main substrate. The sub-substrate has a sub-substrate body, the sub-substrate body has an upper side provided with a first signal pad area and a second signal pad area, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two first grounding pad areas provided respectively on two lateral sides of the first signal pad area and the second signal pad area and constituting a portion of a coplanar waveguide, the sub-substrate body has an inner layer or bottom side provided with a first grounding layer. The circuit board has two lateral portions provided respectively with a first metal pad area and a second metal pad area, there are two second grounding pad areas provided respectively on two lateral sides of each of the first metal pad area and the second metal pad area and constituting a portion of a coplanar waveguide, the circuit board has an inner layer or bottom side provided with a second grounding layer, each of the second grounding pad area is formed with at least one via hole extending through the circuit board in order for the via holes to electrically connect the second grounding pad area and the second grounding layer, the first metal pad area is connected to the first signal pad area by an electrical connection means, the second metal pad area is connected to the second signal pad area by an electrical connection means, and the second grounding layer is connected to the grounding layer on the main substrate by an electrical connection.

Further, the first grounding pad area is connected to the second grounding pad area by an electrical connection mean.

Further, the sub-substrate body is a ceramic heat-dissipating substrate.

Further, the sub-substrate body is aluminum nitride (AlN) or alumina ($Al_2O_3$).

Further, each said electrical connection means is a jumper wire connected to corresponding said pad areas at two ends of the jumper wire.

Further, the first metal pad area and the second metal pad area are respectively connected to two output ends of a differential amplifier.

Further, the jumper wire is a gold wire ribbon or a gold wire.

Further, the circuit board is the printed circuit board (PCB) or the flexible printed circuit (FPC) or the ceramic circuit board.

Further, the ceramic circuit board is aluminum nitride (AlN) or alumina ($Al_2O_3$).

Another object of the present invention is to provide a two-end driving, high-frequency transmission structure, comprising a base and a sub-substrate. The base comprises a body, two electrode pins extending through the body, and an insulation layer provided between the body and each of the two electrode pins respectively. The sub-substrate is configured vertically on the body, wherein the sub-substrate has a sub-substrate body, one vertical side of the sub-substrate body is configured with a first signal pad and a second signal pad, the first signal pad and the second signal pad are connected to the two electrode pins by electrical connection respectively, the other vertical side of the sub-substrate body or the inner layer of the sub-substrate body are configured with a grounding layer or combined with a grounding layer, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, and there are two grounding pad areas provided respectively on two lateral sides of the first signal pad area and the second signal pad area and constituting a portion of a coplanar waveguide.

Further, the base comprises a core column provided on the base and vertical to the body, one vertical side of the core column is provided with conductivity as a combining surface for one side of the sub-substrate body to be fixed and combined with as the grounding layer.

Further, the sub-substrate comprises a gold-plated side layer configured on the side edge of sub-substrate body, wherein the two lateral sides of the gold-plated side layer are connected respectively to the grounding pad area and the grounding layer by an electrical connection.

Further, the grounding pad areas is formed with at least one via hole extending through the sub-substrate body in order for the via holes to electrically connect the grounding pad area and the grounding layer.

Another object of the present invention is to provide a two-end driving, high-frequency sub-substrate structure, comprising a base and a sub-substrate. The base comprises a body, two electrode pins extending through the body, and a core column vertical to the body. There is an insulation layer provided between the body and each of the two electrode pins respectively. One vertical side of the core column is provided as a combining surface. The sub-substrate is configured vertically on the body. the sub-substrate has a sub-substrate body, one vertical side of the sub-substrate body is configured with a first signal pad and second signal pad, the first signal pad and the second signal pad are connected to the two electrode pins by electrical connection respectively, the other vertical side of the sub-substrate body is combined with the combining surface of the core column, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two grounding pad areas provided respectively on two lateral sides of the first signal pad area and the second signal pad area and constituting a portion of a coplanar waveguide.

Further, the sub-substrate comprises a gold-plated side layer configured on the side edge of sub-substrate body, wherein the two lateral sides of the gold-plated side layer are connected to the grounding pad area and the grounding layer respectively by an electrical connection.

Further, the grounding pad areas is formed with at least one via hole extending through the sub-substrate body in order for the via holes to electrically connect the grounding pad area and the grounding layer.

Further, the sub-substrate body is a ceramic heat-dissipating substrate.

Further, the sub-substrate body is aluminum nitride (AlN) or alumina ($Al_2O_3$).

Further, the jumper wire is a gold wire ribbon or a gold wire.

Therefore, the present invention has the following advantages comparing to the prior art:

1. The present invention has excellent high-frequency transmission properties and is less prone to signal loss and signal distortion than the prior art.

2. Thanks to the two-end driving technique, the present invention can reduce reflection in signal transmission and dispense with resistors otherwise required to achieve impedance matching.

3. The present invention features exceptionally effective heat dissipation to prevent excessive heat from accumulating in, and having an adverse effect on the operation of, the semiconductor device.

DETAILED DESCRIPTION OF THE INVENTION

The present invention provides a driving circuit configured for two-end driving and for use with an optical communication module to carry out high-frequency signal transmission. In order to transmit high-frequency signals, the sub-substrate carrying the semiconductor chip has signal transmission wires formed as a grounded coplanar waveguide (GCPW) to reduce the parasitic effect associated with high-frequency transmission, thereby preventing discontinuous impedance matching and the generation of noise. In one embodiment, the flexible printed circuit (FPC) or printed circuit board (PCB) used in combination with the sub-substrate is also provided with GCPW signal transmission wires, and test results have shown that better signal connection can be achieved when both the FPC (or PCB) and the sub-substrate use GCPW signal transmission wires. In this driving circuit configured for two-end driving, the use of GCPW signal transmission wires in both the sub-substrate and the FPC (or PCB) helps improve signal continuity in the jumper wire between the signal transmission wires and the semiconductor chip, as demonstrated further below by the experimental data. The following paragraphs detail the structure of a preferred embodiment of the present invention first.

Figure 1:
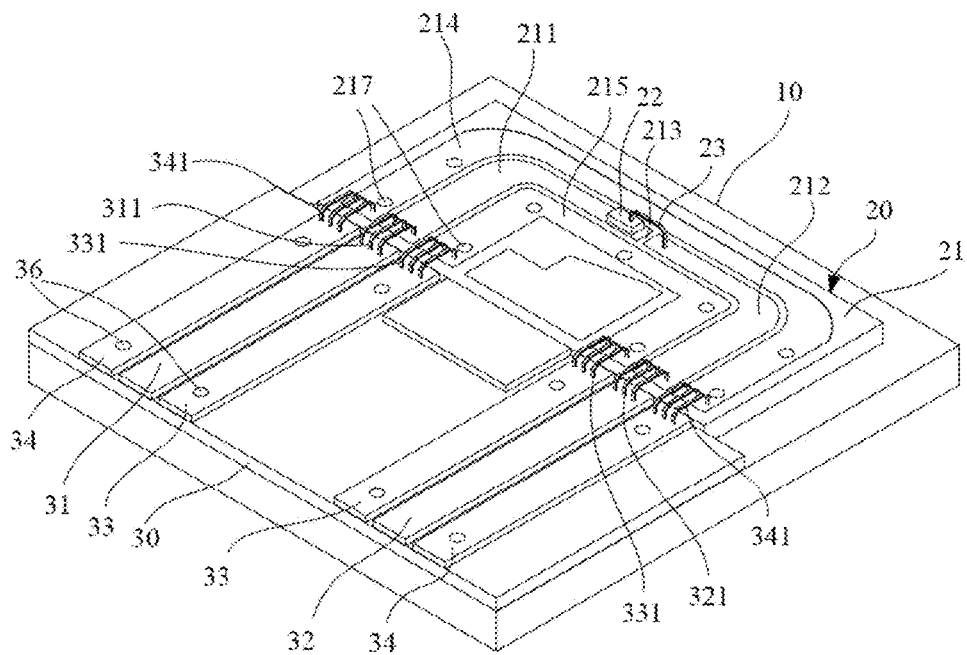
FIG. 1 is a perspective view of the first embodiment of the present invention.
Figure 2:
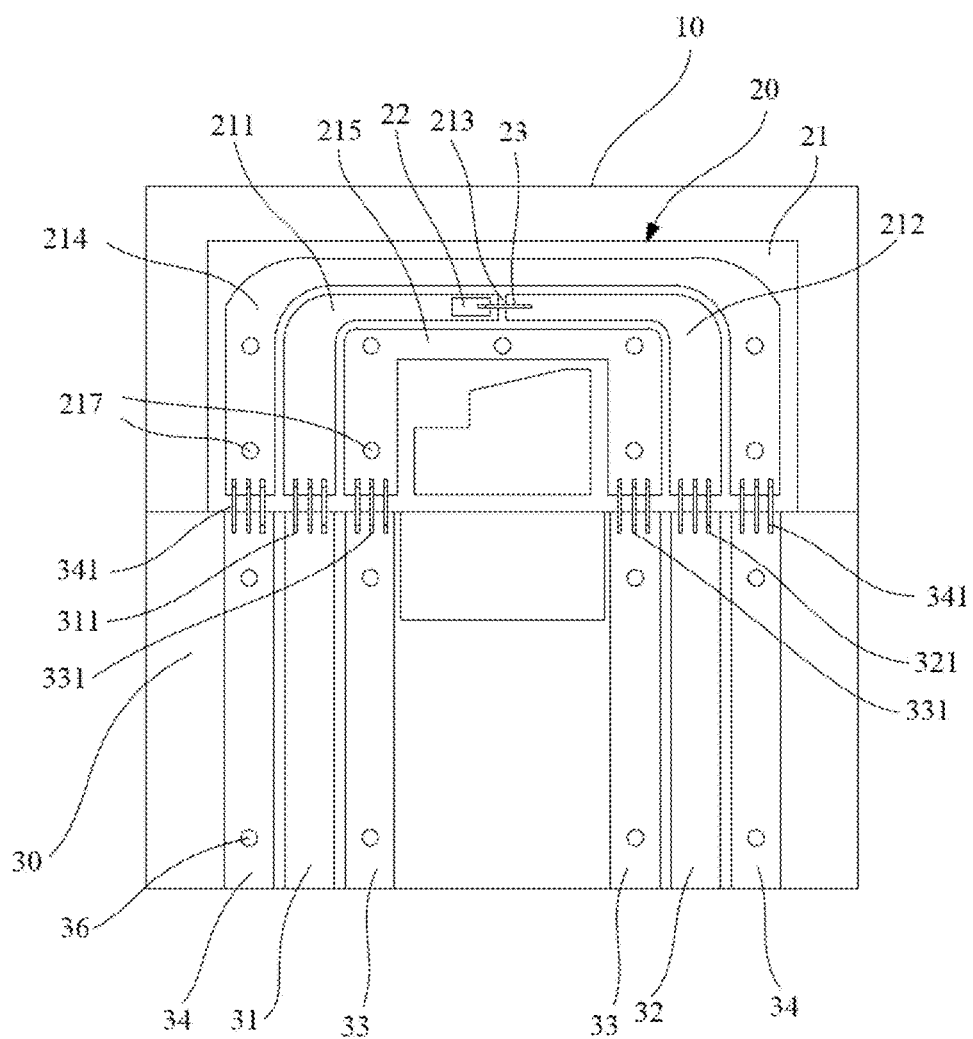
FIG. 2 is a top view of the first embodiment of the present invention.
Figure 3:
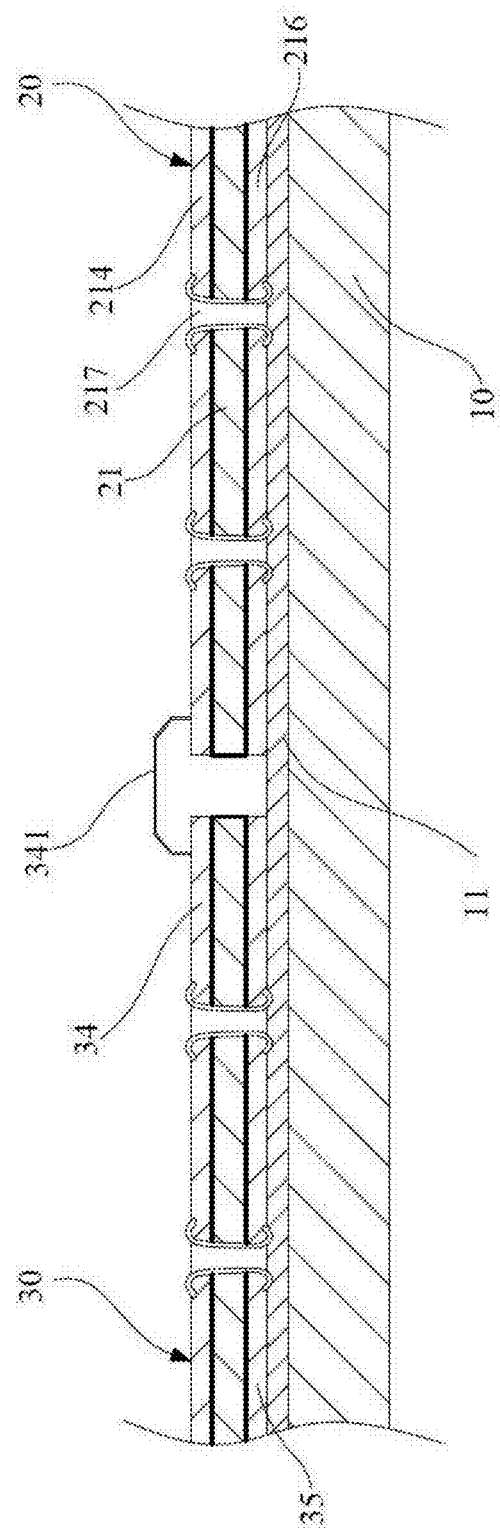
FIG. 3 is a sectional view of the first embodiment of the present invention.

Refer to FIG. 1, FIG. 2, and FIG. 3, which show the first embodiment of the present invention in perspective view, in top view, and in sectional view respectively.

The high-frequency transmission structure 100 in this embodiment essentially includes a main substrate 10, a sub-substrate 20 provided on the main substrate 10, and a circuit board 30 provided on the main substrate 10 and electrically connected to the sub-substrate 20.

The main substrate 10 may be a PCB, a ceramic board, or a plate or housing configured solely for supporting the sub-substrate 20 and the circuit board 30. The present invention has no limitation in this regard.

The sub-substrate 20 provided on the main substrate 10 is preferably fixed to the main substrate 10 by a thermally conductive adhesive, an electrically conductive adhesive, or a silver paste, or by welding an AuSn-based material. The present invention imposes no limitation in this regard, either. The sub-substrate 20 has a sub-substrate body 21. The upper side of the sub-substrate body 21 is provided with a first signal pad area 211 and a second signal pad area 212. The first signal pad area 211 and the second signal pad area 212 are symmetric with respect to each other. Each of the first signal pad area 211 and the second signal pad area 212 extends from one of two lateral portions of the sub-substrate body 21 in an extending direction toward the center of the sub-substrate body 21 and terminates in an end. The aforesaid end of the first signal pad area 211 is adjacent to, but spaced by a distance 213 from, the aforesaid end of the second signal pad area 212. The first signal pad area 211 is configured for supporting a semiconductor chip 22 that is provided on the first signal pad area 211. The second signal pad area 212 is provided with a jumper wire 23 connected to an electrode on the upper side of the semiconductor chip 22. An electrode on the lower side of the semiconductor chip 22 is electrically connected to the underlying first signal pad area 211. The semiconductor chip 22 is to be driven by the differential signals between the first signal pad area 211 and the second signal pad area 212. In this preferred embodiment, the term "symmetric" refers to the two lateral metal pad areas (i.e., the first signal pad area 211 and the second signal pad area 212) being laid out and shaped in an identical manner. These pad areas, however, are not necessarily so laid out or shaped. More specifically, the first signal pad area 211 and the second signal pad area 212 need not have the same layout or shape, provided that they meet the symmetry requirement for impedance matching. Moreover, the jumper wire 23 is preferably a gold wire ribbon for increased signal continuity. In another preferred embodiment, the semiconductor chip 22 is provided on the second signal pad area 212 instead, and the jumper wire 23 is provided on the first signal pad area 211 and is connected to the electrode on the upper side of the semiconductor chip 22. This alternative arrangement is equivalent to that described above and shown in the drawings.

As shown in FIG. 3, the first signal pad area 211 and the second signal pad area 212 employ the principle of a GCPW to increase the stability, and hence improve the transmission, of high-frequency signals. A first grounding pad area 214 and a first grounding pad area 215, which constitute part a coplanar waveguide, are provided on two lateral sides of the first signal pad area 211 and the second signal pad area 212 respectively. A first grounding layer 216 is provided on the bottom side of the sub-substrate body 21. One or a plurality of via holes 217 are formed in each of the first grounding pad areas 214 and 215 and extend through the sub-substrate body 21 to electrically connect the first grounding pad areas 214 and 215 and the first grounding layer 216. In another preferred embodiment, the first grounding layer 216 is provided as an inner layer of the sub-substrate body 21 instead; the present invention imposes no limitation in this regard. Beside the above embodiment, the first grounding layer 216 can also be replaced by a grounding layer 11 of the main substrate 10; the present invention imposes no limitation in this regard.

To facilitate heat dissipation, the sub-substrate body 21 of the sub-substrate 20 is preferably a ceramic heat-dissipating substrate, such as alumina ($Al_2O_3$), aluminum nitride (AlN), or a material doped with $Al_2O_3$ or AlN. The aforementioned materials allow heat to dissipate rapidly from the sub-substrate 20 through the main substrate 10 to a housing (not shown). In addition, the body of the main substrate 10 may be provided with a heat guiding mechanism configured to work with the sub-substrate 20; the present invention has no limitation in this respect.

A first metal pad area 31 and a second metal pad area 32 are provided on two lateral portions of the circuit board 30 respectively. A second grounding pad area 33 and a second grounding pad area 34, which constitute part of a coplanar waveguide, are provided on two lateral sides of each of the first metal pad area 31 and the second metal pad area 32 respectively. The first metal pad area 31 is connected to the first signal pad area 211 by an electrical connection means 311. The second metal pad area 32 is connected to the second signal pad area 212 by an electrical connection means 321. Each of the second grounding pad areas 33 is connected to the first grounding pad area 215 by an electrical connection means 331. Each of the second grounding pad areas 34 is connected to the first grounding pad area 214 by an electrical connection means 341. A second grounding layer 35 is provided as an inner layer, or on the bottom side, of the circuit board 30. One or a plurality of via holes 36 are formed in each of the second grounding pad areas 33 and 34 and extend through the circuit board 30 to electrically connect the second grounding pad areas 33 and 34 and the second grounding layer 35. In a preferred embodiment, each of the electrical connection means 311, 321, 331, and 341 is a jumper wire connected to the corresponding pad areas at its two ends. To enhance signal continuity, the jumper wire is preferably a gold wire ribbon. Furthermore, the electrical connection means 311, 321, 331, and 341 may be solder balls or other similar electrical joints instead of jumper wires each configured to connect the pad areas at its two ends. The present invention has no limitation on the form of the electrical connection means 311, 321, 331, and 341. The circuit board 30 may be a PCB, an FPC, or a ceramic circuit board made, for example, of AlN or $Al_2O_3$.

Figure 4:
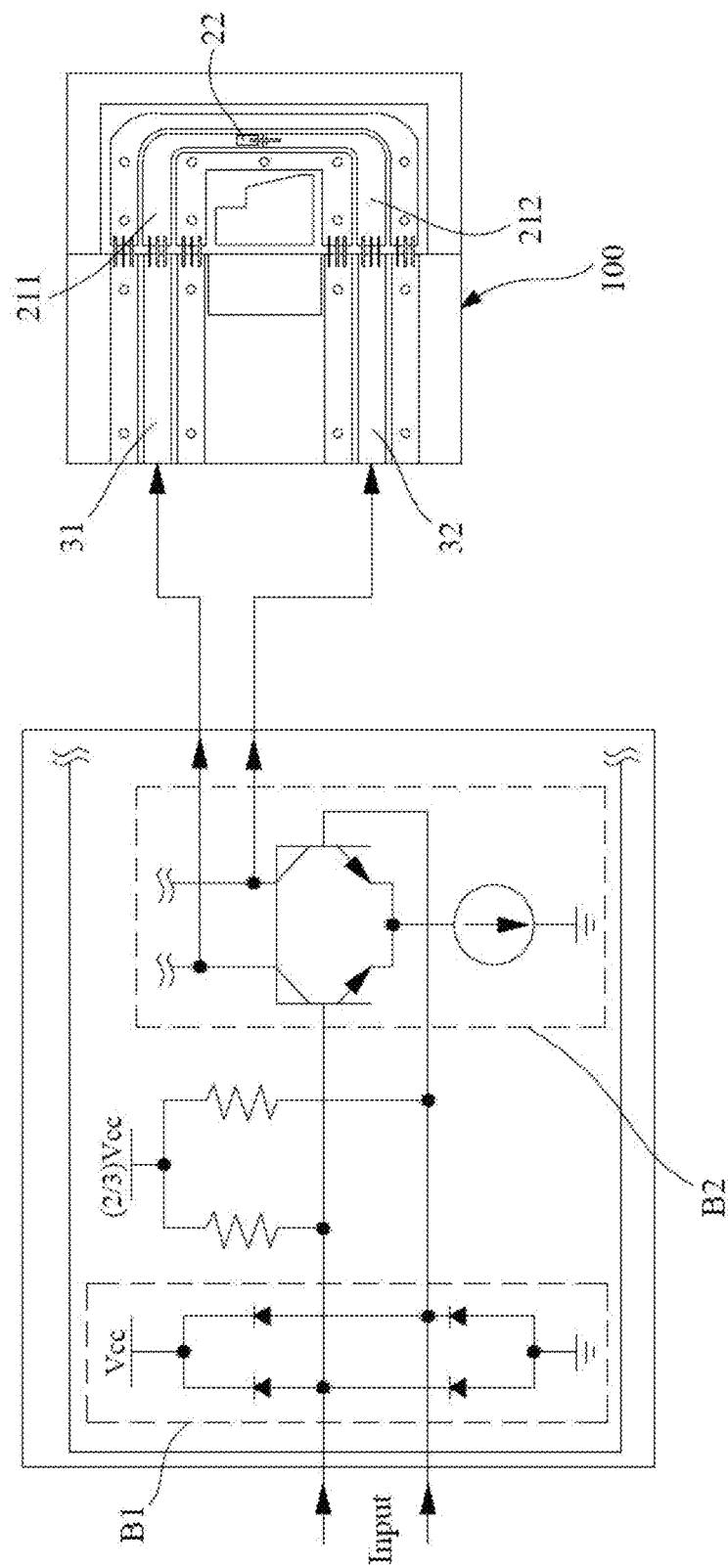
FIG. 4 schematically shows a circuit for the first embodiment of the present invention.

Referring to FIG. 4, the sub-substrate 20 in this embodiment feeds signals to the semiconductor chip 22 in a two-end driving manner. The front end of the circuit board 30 is provided with an electrostatic discharge (ESD) protection circuit B1 and a differential driving circuit B2. Input signals are fed through the ESD protection circuit B1 to the input ends of the differential driving circuit B2. The differential driving circuit B2 converts the input differential signals into amplified differential signals and outputs the latter signals in order to feed the differential signals to the semiconductor chip 22 through the first signal pad area 211 and the second signal pad area 212 of the circuit board 20 respectively. Driven by the differential signals received, the semiconductor chip 22 sends out a signal-carrying light beam, which is guided into an optical fiber (not shown) for optical communication.

Figure 5:
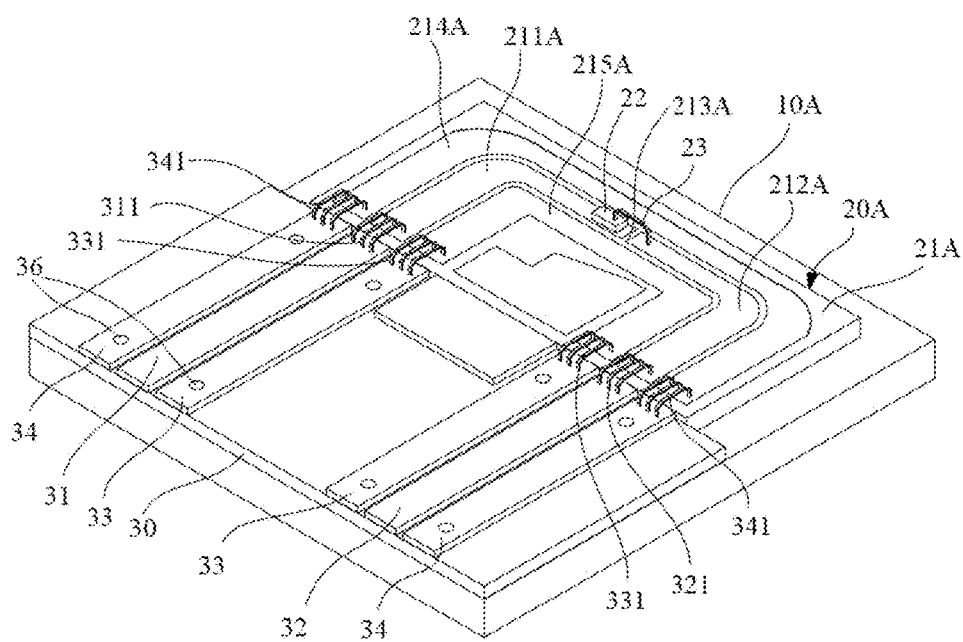
FIG. 5 is a perspective view of the second embodiment of the present invention.
Figure 6:
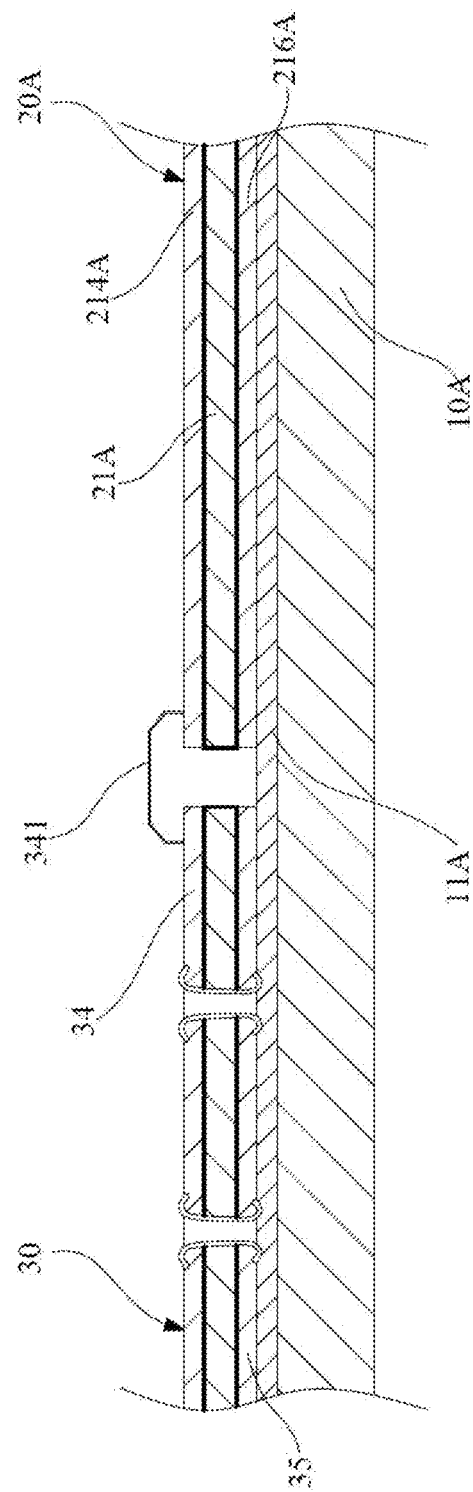
FIG. 6 is a sectional view of the second embodiment of the present invention.

The following paragraphs provide and discuss the second embodiment of the present invention. Please refer to FIG. 5 and FIG. 6, each of which represents the perspective view and sectional view of the second embodiment of the present invention.

The main difference between this embodiment and the first embodiment is the design of the sub-substrate; therefore, the following has no repeating description for the same part of the embodiments:

The high-frequency transmission structure 200 in this embodiment has a sub-substrate 20A provided on the main substrate 10A and the sub-substrate 20A comprises a sub-substrate body 21A. The sub-substrate body 21A has an upper side provided with a first signal pad area 211A and a second signal pad area 212A, the first signal pad area 211A and the second signal pad area 212A are symmetric with respect to each other, each of the first signal pad area 211A and the second signal pad area 212A extends from one of two lateral portions of the sub-substrate body 21A in an extending direction toward a center of the sub-substrate body 21A and terminates in an end, the end of the first signal pad area 211A is adjacent to but spaced from the end of the second signal pad area 212A, the first signal pad area 211A is configured for supporting a semiconductor chip 22 provided thereon, the second signal pad area 212A is provided with a jumper wire 23 connected to an electrode of the semiconductor chip 22, the electrode below the semiconductor chip 22 is connected to the second signal pad area 212A by electrical connection, and the semiconductor chip 22 is driven by the differential signals between the first signal pad area 211A and the second signal pad area 212A.

This embodiment also employs the principle of a GCPW to increase the stability, and hence improve the transmission, of high-frequency signals. The main difference comparing to the aforementioned first embodiment is that the first grounding pad area 214A and the second grounding pad area 215A on the lateral side of the first signal pad area 211A and the second signal pad area 212A are not provided with via holes, and the first grounding layer 216 of the sub-substrate 20A is connected to the second grounding layer 35 of the circuit board 30 through the grounding layer 11A of the main substrate 10A, such that the first grounding layer 216 of the sub-substrate 20A shares the grounding line with the second grounding layer 35 of the circuit board 30, which can also reduce the effects of damaging and distorting the signal. Beside the above embodiment, the first grounding layer 216A can also be replaced by a grounding layer 11A of the main substrate 10A; the present invention imposes no limitation in this regard.

The grounding layer 11A in this embodiment can be, for example, line layout configured on the main substrate, metal foil configured on the main substrate, solder or plating configured on the main substrate, or the likes configured on the main substrate; the present invention imposes no limitation to the example of the grounding layer 11A.

Figure 7:
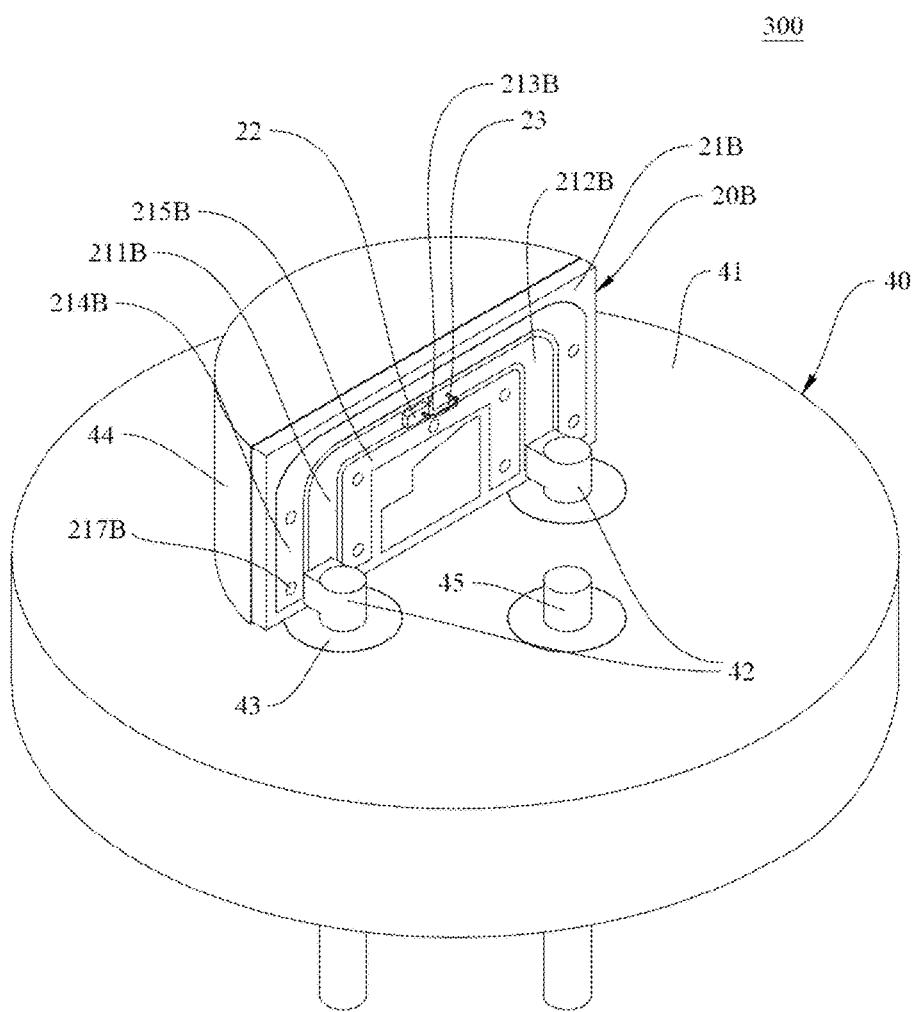
FIG. 7 is a perspective view of the third embodiment of the present invention.
Figure 8:
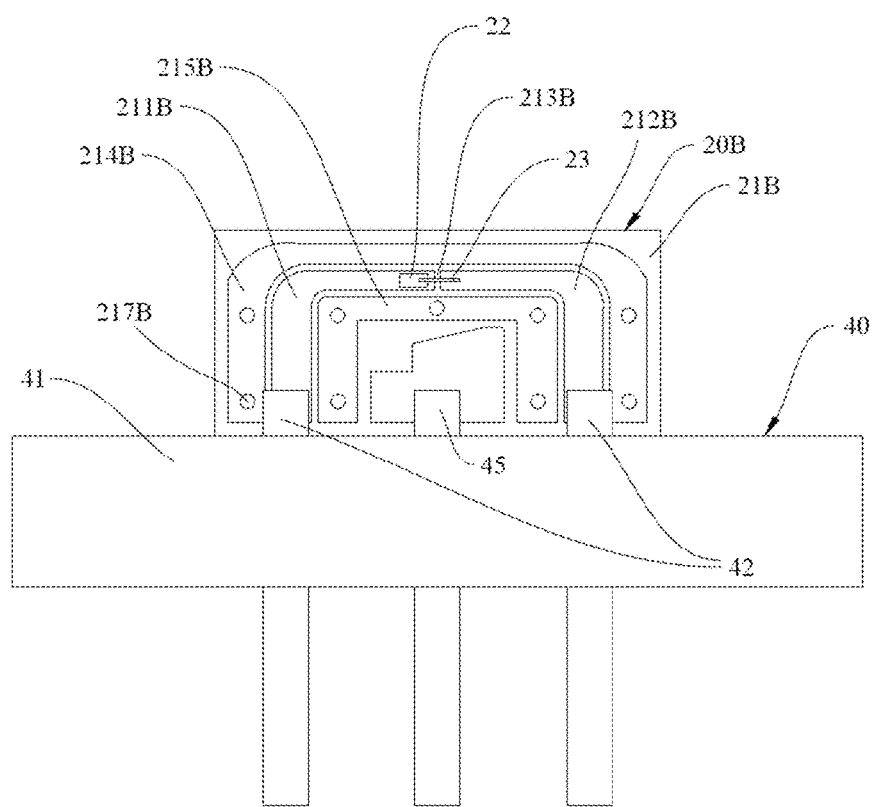
FIG. 8 is a front view of the third embodiment of the present invention.
Figure 9:
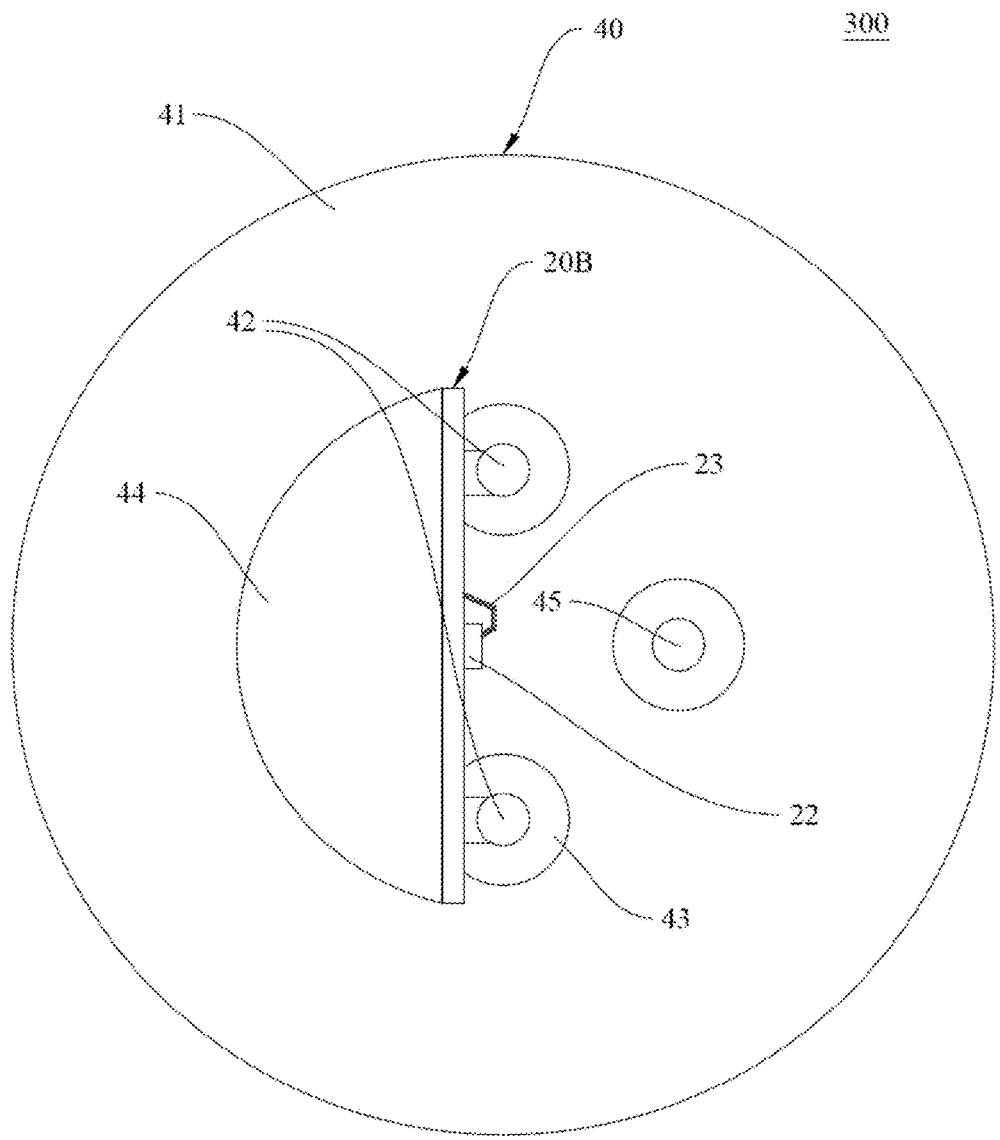
FIG. 9 is a top view of the third embodiment in of the present invention.

The following paragraphs provide and discuss the third embodiment of the present invention. Please refer to FIG. 7, FIG. 8, and FIG. 9, each of which represents the perspective view, front view, and top view of the third embodiment of the present invention.

The main difference between this embodiment and the first and second embodiments is the design of the sub-substrate.

The high-frequency transmission structure 300 in this embodiment has a base 40 and a sub-substrate 20B.

The base 40 comprises a body 41, two electrode pins 42 extending through the body 41, and an expanding pin 45 extending through the body 41. There is an insulation layer 43 provided between the body 41 and each of the two electrode pins 42 respectively and the expanding pin 45. In a preferred embodiment, the base 40 comprises a core column 44 configured vertically on the body 41 and one vertical side of the core column 44 is provided as a combining surface for one side of the sub-substrate 20B to combine with. In another preferred embodiment, the sub-substrate 20B can be vertically fixed on the body 41 by other positioning means, such as welding, adhering, plugging, or the likes; the present invention imposes no limitation.

The sub-substrate 20B has a sub-substrate body 21B. The sub-substrate body 21B has an upper side provided with a first signal pad area 211B and a second signal pad area 212B, the first signal pad area 211B and the second signal pad area 212B are symmetric with respect to each other, each of the first signal pad area 211B and the second signal pad area 212B extends from one of two lateral portions of the sub-substrate body 21B in an extending direction toward a center of the sub-substrate body 21B and terminates in an end, the end of the first signal pad area 211B is adjacent to but spaced from the end of the second signal pad area 212B, the first signal pad area 211B is configured for supporting a semiconductor chip 22 provided thereon, the second signal pad area 212B is provided with a jumper wire 23 connected to an electrode of the semiconductor chip 22, the electrode below the semiconductor chip 22 is connected to the first signal pad area 211B by electrical connection, and the semiconductor chip 22 is driven by the differential signals between the first signal pad area 211B and the second signal pad area 212B. Due to the first grounding pad area 214B and second grounding pad areas 215B provided respectively on two lateral sides of the first signal pad area 211B and the second signal pad area 212B and constituting a portion of a coplanar waveguide, this embodiment employs the principle of a GCPW to increase the stability.

Figure 10:
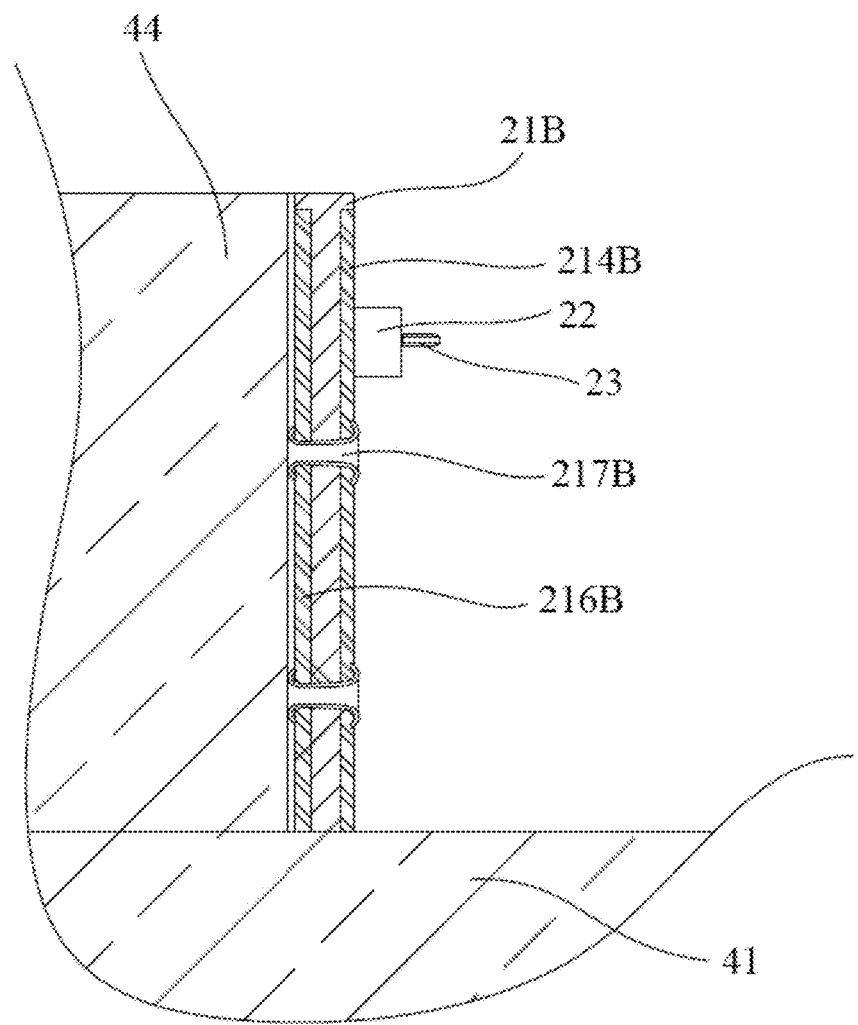
FIG. 10 is a sectional view of the third embodiment of the present invention.
Figure 11:
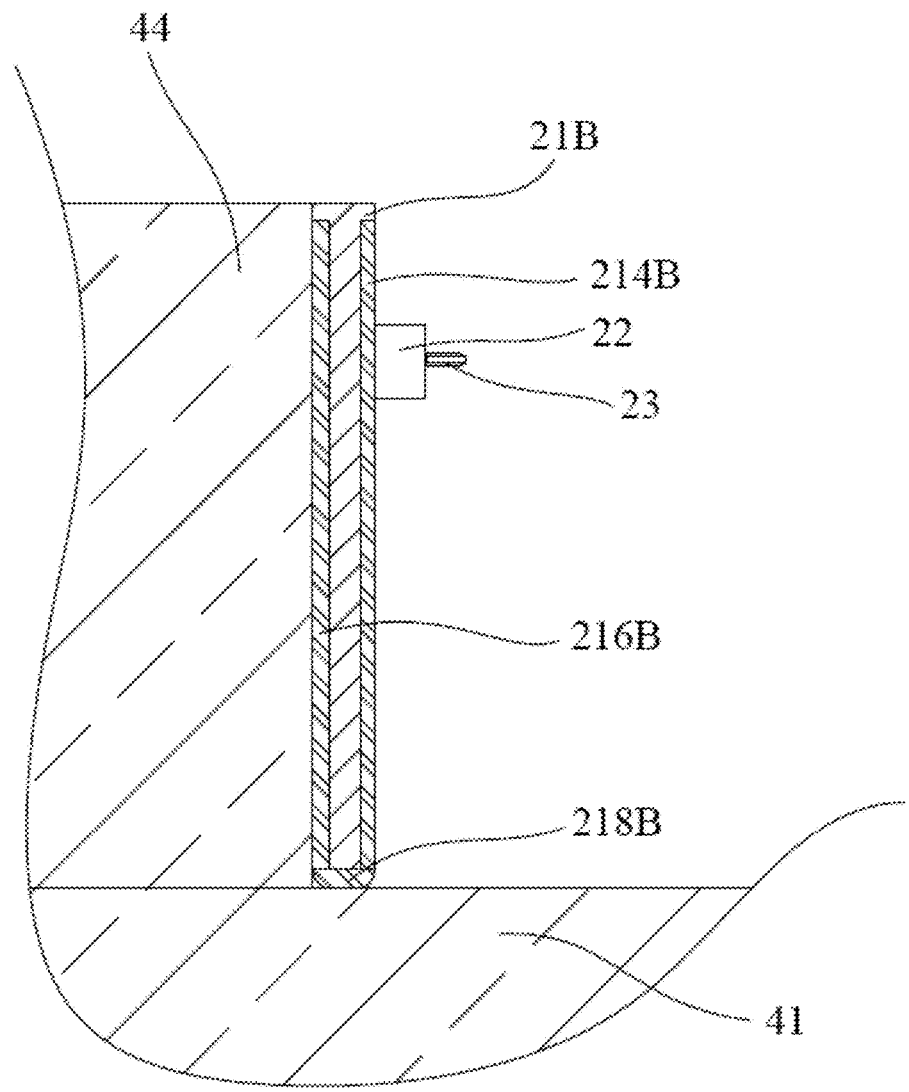
FIG. 11 is a sectional view of the preferred embodiment of the present invention.

Further, the sub-substrate 20B is vertically configured on the body 41, one vertical side of the sub-substrate body 21B is configured with a first signal pad area 211B and a second signal pad area 212B, and the first signal pad area 211B and the second signal pad area 212B are connected to the two electrode pins 42 by electrical connection respectively. Specifically, the first signal pad area 211B and the second signal pad area 212B can be electrically connected to the two electrode pins 42 by welding or the likes, such as the jump wire, the present invention has no limitation. The other vertical side of the sub-substrate body 21B or the inner layer of the sub-substrate body 21B is configured with a grounding layer 216B. To connecting the grounding layer 216B with the grounding area pads 214B and 215B on the upper side of the sub-substrate 21B, referring to FIG. 10, the grounding pad areas 214B or 215B is formed with at least one via hole 217B extending through the sub-substrate body 21B in order for the via holes 217B to electrically connect the grounding pad area 214B or 215B and the grounding layer 216B. In another preferred embodiment, referring to FIG. 11, the sub-substrate 20B comprises a gold-plated side layer 218B configured on the side edge of sub-substrate body 21B, wherein the two lateral sides of the gold-plated side layer 218B are connected respectively to the grounding pad areas 214B or 215B and the grounding layer 216B by an electrical connection. The grounding pad areas 214B or 215B and the grounding layer 216B can be connected to base 41 by the gold-plated side layer 218B for grounding such that the parasitic capacitance can be inhibited.

In another preferred embodiment, the sub-substrate 20B, instead of being configured on the grounding layer 216B, can use the core column 44 to replace the grounding layer 216B for grounding, and the grounding pad areas 214B or 215B can be connected with the body 41 (such as the aforementioned gold-plated side layer 218B and welding) or one vertical side of the core column 44 (such as the aforementioned via holes 217B) by electrical connection for obtaining the same effect of inhibiting parasitic capacitance.

The following paragraphs provide and discuss the experimental data of the present invention. To begin with, please refer to FIG. 12 to FIG. 16, each of which discloses a plot or plots based on the experiment results of a conventional microstrip sub-substrate used in conjunction with a microstrip circuit board (B) and of a GCPW sub-substrate of the present invention used in conjunction with a GCPW circuit board (A).

In each of FIG. 12 to FIG. 16, the experimental group is a sub-substrate 20 of the present invention, which has a GCPW circuit and is used in conjunction with a circuit board 30 with a GCPW circuit, whereas the control group is a conventional microstrip sub-substrate used in conjunction with a microstrip circuit board. The experimental data of the experimental groups are indicated as A in the drawings, and those of the control groups, as B. In each experimental group A, signals are fed through the first metal pad area 31 and the second metal pad area 32 of the circuit board 30 in order to obtain detection signals from the first signal pad area 211 and the jumper wire 23, which serve as the output ends. In each control group B, signals are fed through signal wires of the microstrip circuit board in order to obtain detection signals from the output ends (i.e., signal wires) of the microstrip sub-substrate.

Figure 12:
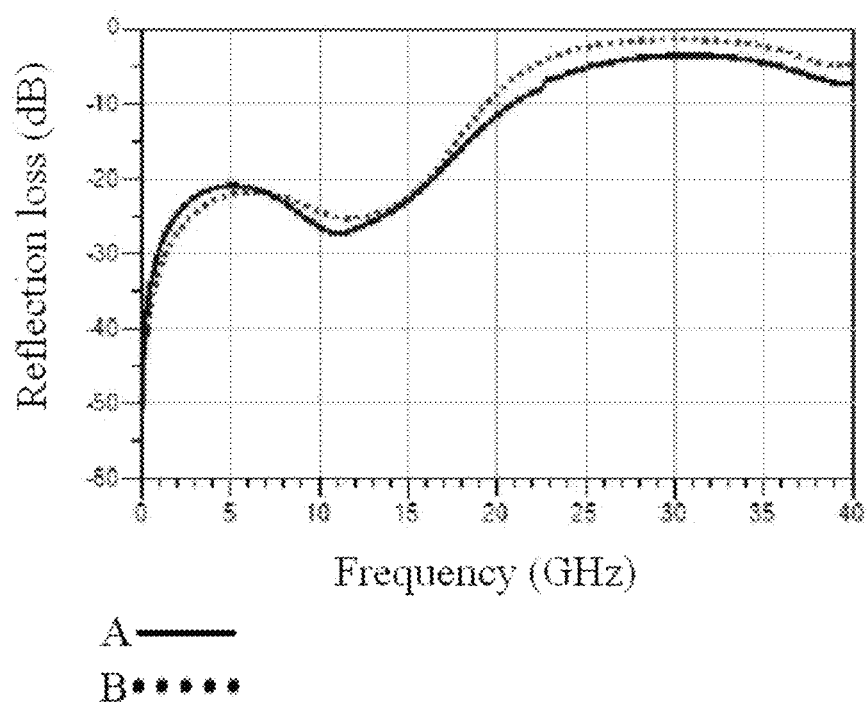
FIG. 12 is a plot showing the reflection loss experiment results of a conventional microstrip sub-substrate used in conjunction with a microstrip circuit board (B) and of a GCPW sub-substrate of the present invention used in conjunction with a GCPW circuit board (A)

In FIG. 12, the solid line represents the experimental group A, the dotted line represents the control group B, the vertical axis represents reflection loss (unit: dB), and the horizontal axis represents frequency (unit: GHz). As can be seen in FIG. 12, the power level (in the unit of dB) of the reflection loss of the experimental group A is significantly lower than that of the control group B when the input signals are high-frequency (higher than 20 GHz) signals.

Figure 13:
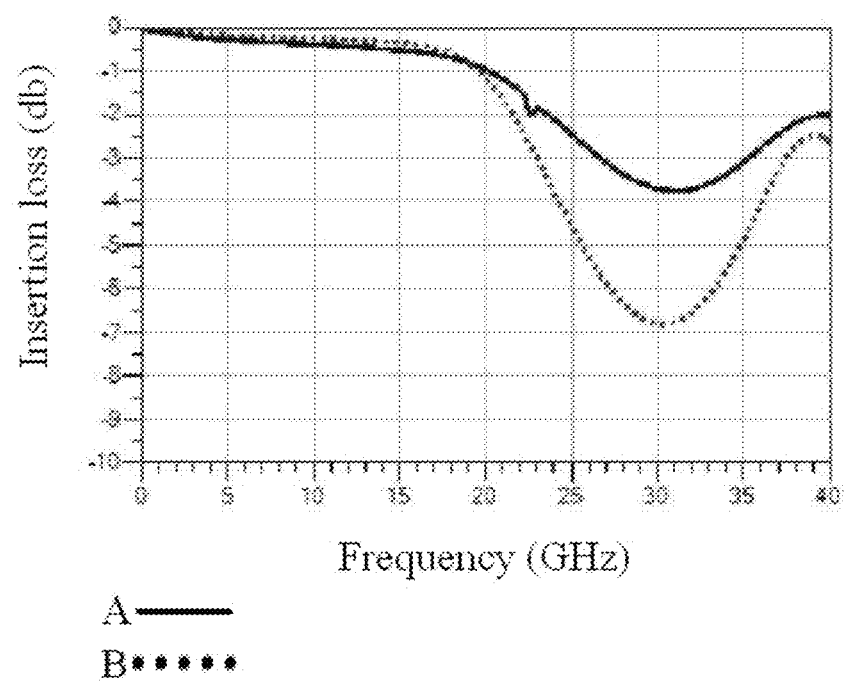
FIG. 13 is a plot showing the insertion loss experiment results of a conventional microstrip sub-substrate used in conjunction with a microstrip circuit board (B) and of a GCPW sub-substrate of the present invention used in conjunction with a GCPW circuit board (A)

In FIG. 13, the solid line represents the experimental group A, the dotted line represents the control group B, the vertical axis represents insertion loss (unit: dB), and the horizontal axis represents frequency (unit: GHz). As can be seen in FIG. 13, the power level (in the unit of dB) of the insertion loss of the experimental group A is much higher than that of the control group B when the input signals are high-frequency (higher than 20 GHz) signals. This means that insertion loss is significantly reduced in the experimental group A, as compared with that in the control group B.

Figure 14:
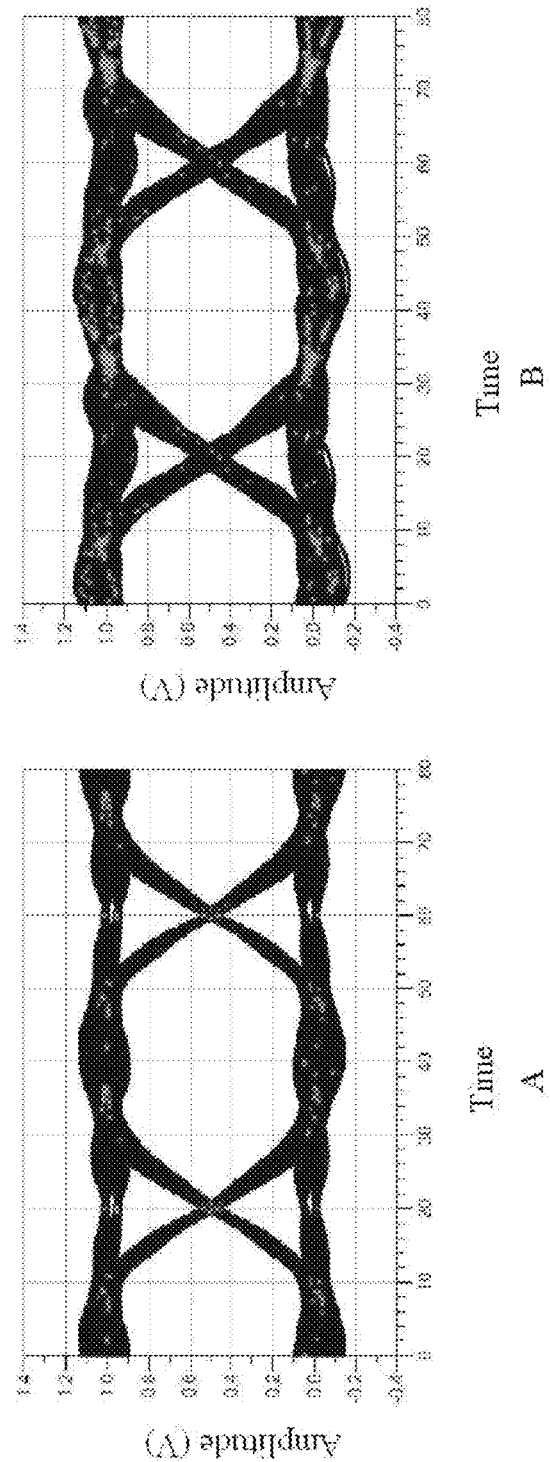
FIG. 14 shows two plots presenting respectively the experimental data of a conventional microstrip sub-substrate used in conjunction with a microstrip circuit board (B) and of a GCPW sub-substrate of the present invention used in conjunction with a GCPW circuit board (A) when the feed signals have a bit rate of 25 Gbps.

In FIG. 14, the plot on the left shows the experimental data of the experimental group A, and the plot on the right shows the experimental data of the control group B. The vertical axis in each plot represents signal amplitude (unit: Voltage) while the horizontal axis represents time (unit: second). When the feed signals have a bit rate of 25 Gbps, the amplitudes of the output signals of the experimental group A remain at reasonable values. By contrast, a slight structural insertion loss has rendered the waveforms of the output signals of the control group B relatively unstable, although the difference between signals is identifiable.

Figure 15:
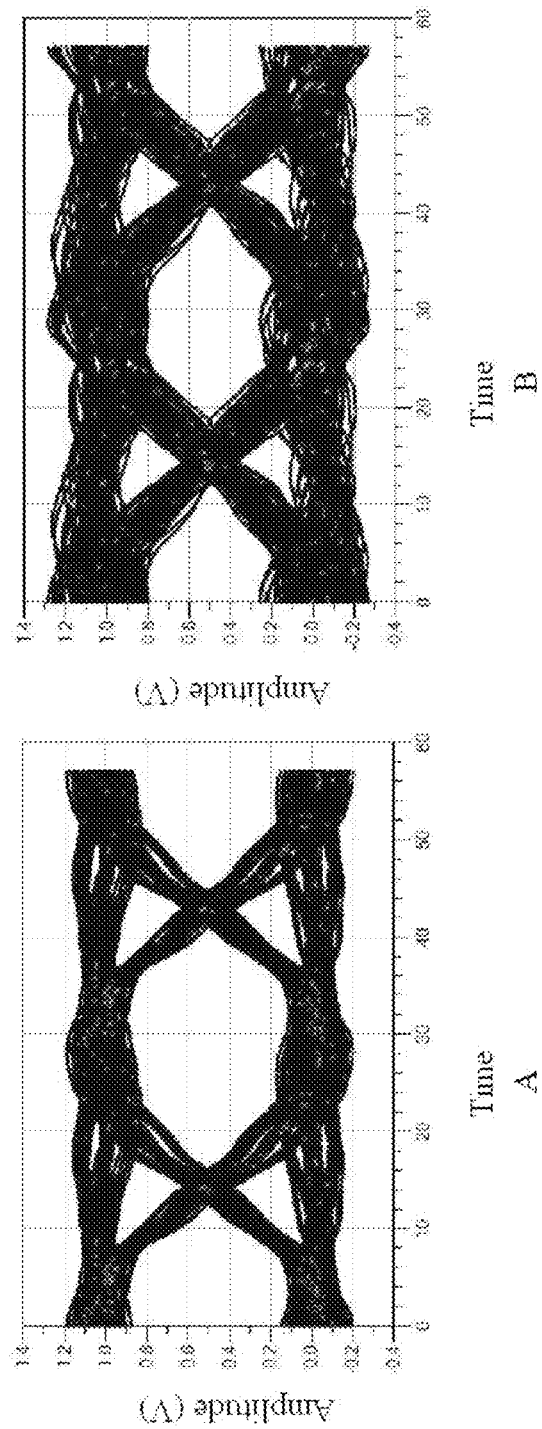
FIG. 15 shows two plots presenting respectively the experimental data of a conventional microstrip sub-substrate used in conjunction with a microstrip circuit board (B) and of a GCPW sub-substrate of the present invention used in conjunction with a GCPW circuit board (A) when the feed signals have a bit rate of 35 Gbps.

In FIG. 15, the plot on the left shows the experimental data of the experimental group A, and the plot on the right shows the experimental data of the control group B. The vertical axis in each plot represents signal amplitude (unit: Voltage) while the horizontal axis represents time (unit: second). When the feed signals have a bit rate of 35 Gbps, the amplitudes of the output signals of the experimental group A still stay at reasonable values, but a great structural insertion loss has rendered the waveforms of the output signals of the control group B even more unstable, with the amplitude of noise approaching 0.5 V. The signal-to-noise ratio of the control group B is much lower than that of the experimental group A.

Figure 16:
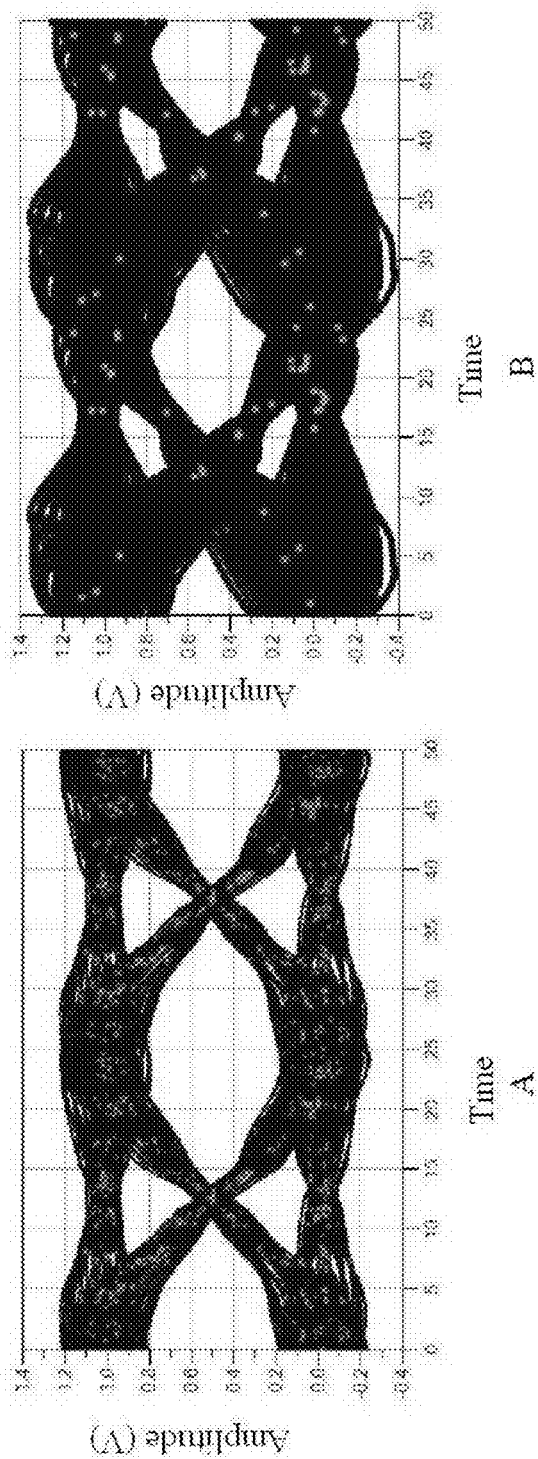
FIG. 16 shows two plots presenting respectively the experimental data of a conventional microstrip sub-substrate used in conjunction with a microstrip circuit board (B) and of a GCPW sub-substrate of the present invention used in conjunction with a GCPW circuit board (A) when the feed signals have a bit rate of 40 Gbps.

In FIG. 16, the plot on the left shows the experimental data of the experimental group A, and the plot on the right shows the experimental data of the control group B. The vertical axis in each plot represents signal amplitude (unit: Voltage) while the horizontal axis represents time (unit: second). When the feed signals have a bit rate of 40 Gbps, the amplitudes of the output signals of the experimental group A remain at reasonable values, but the waveforms of the output signals of the control group B are now indistinguishable, with the amplitude of noise approaching 0.6 V. Consequently, the control group B has a very low signal-to-noise ratio.

According to the experimental data shown in FIG. 12 to FIG. 16, the GCPW sub-substrates and GCPW circuit boards of the present invention can suppress noise and reduce insertion loss as well as reflection loss much more effectively than the control groups when fed with high-frequency signals.

Therefore, the present invention has the following advantages comparing to the prior art: Firstly, the present invention has excellent high-frequency transmission properties and is less prone to signal loss and signal distortion than the prior art. Secondly, thanks to the two-end driving technique, the present invention can reduce reflection in signal transmission and dispense with resistors otherwise required to achieve impedance matching. Lastly, the present invention features exceptionally effective heat dissipation to prevent excessive heat from accumulating in, and having an adverse effect on the operation of, the semiconductor device.

While the present invention has been described in connection with certain exemplary embodiments, it is to be understood that the invention is not limited to the disclosed embodiments, but, on the contrary, intended to cover various modifications and equivalent arrangements included within the spirit and scope of the appended claim, and the equivalent thereof.

What is claimed is:

1. A two-end driving, high-frequency sub-substrate structure, comprising a sub-substrate body, wherein: the sub-substrate body has an upper side provided with a first signal pad area and a second signal pad area, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two grounding pad areas provided respectively on two lateral sides of the first signal pad area and the second signal pad area and constituting a portion of a coplanar waveguide, and the sub-substrate body has an inner layer or bottom side that is provided with a grounding layer or combined with a grounding layer.

2. The two-end driving, high-frequency sub-substrate structure of claim 1, wherein each of the grounding pad areas is formed with at least one via hole extending through the sub-substrate body in order for the via holes to electrically connect the grounding pad areas and the grounding layer.

3. The two-end driving, high-frequency sub-substrate structure of claim 1, wherein the sub-substrate body is a ceramic heat-dissipating substrate.

4. The two-end driving, high-frequency sub-substrate structure of claim 1, wherein the jumper wire is a gold wire ribbon or a gold wire.

5. A two-end driving, high-frequency transmission structure, comprising:
a main substrate;
a sub-substrate provided on the main substrate, wherein the sub-substrate has a sub-substrate body, the sub-substrate body has an upper side provided with a first signal pad area and a second signal pad area, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, there are two first grounding pad area provided for the two lateral sides of the first signal pad area and the second signal pad area and constituting a portion of a coplanar waveguide, the sub-substrate body has an inner layer or bottom side that is provided with a first grounding layer or combined with a grounding layer; and a circuit board provided on the main substrate, wherein the circuit board has two lateral portions provided respectively with a first metal pad area and a second metal pad area, there are two second grounding pad areas provided respectively on two lateral sides of each of the first metal pad area and the second metal pad area and constituting a portion of a coplanar waveguide, the circuit board has an inner layer or bottom side provided with a second grounding layer, each of the second grounding pad area is formed with at least one via hole extending through the circuit board in order for the via holes to electrically connect the second grounding pad areas and the second grounding layer, the first metal pad area is connected to the first signal pad area by an electrical connection means, the second metal pad area is connected to the second signal pad area by an electrical connection means.

6. The two-end driving, high-frequency transmission structure of claim 5, wherein the first grounding pad areas is formed with at least one via hole extending through the sub-substrate body in order for the via holes to electrically connect the first grounding pad areas and the first grounding layer.

7. The two-end driving, high-frequency transmission structure of claim 5, wherein the first grounding pad area is connected to the second grounding pad area by an electrical connection mean.

8. The two-end driving, high-frequency transmission structure of claim 5, wherein the sub-substrate body is a ceramic heat-dissipating substrate.

9. The two-end driving, high-frequency transmission structure of claim 5, wherein each said electrical connection means is a jumper wire connected to corresponding said pad areas at two ends of the jumper wire.

10. The two-end driving, high-frequency transmission structure of claim 5, wherein the first metal pad area and the second metal pad area are respectively connected to two output ends of a differential amplifier.

11. The two-end driving, high-frequency transmission structure of claim 5, herein the jumper wire is a gold wire ribbon or a gold wire.

12. The two-end driving, high-frequency transmission structure of claim 5, herein the circuit board is the printed circuit board (PCB) or the flexible printed circuit (FPC) or the ceramic circuit board.

13. A two-end driving, high-frequency transmission structure, comprising:

a base, comprising a body, two electrode pins extending through the body, and an insulation layer provided between the body and each of the two electrode pins respectively; and a sub-substrate, configured vertically on the body, wherein: the sub-substrate has a sub-substrate body, one vertical side of the sub-substrate body is configured with a first signal pad area and a second signal pad area, the first signal pad area and the second signal pad area are connected to the two electrode pins by electrical connection respectively, the other vertical side of the sub-substrate body or the inner layer of the sub-substrate body is configured with a grounding layer or combined with a grounding layer, the first signal pad area and the second signal pad area are symmetric with respect to each other, each of the first signal pad area and the second signal pad area extends from one of two lateral portions of the sub-substrate body in an extending direction toward a center of the sub-substrate body and terminates in an end, the end of the first signal pad area is adjacent to but spaced from the end of the second signal pad area, the first signal pad area is configured for supporting a semiconductor chip provided thereon, the second signal pad area is provided with a jumper wire connected to an electrode of the semiconductor chip, and there are two grounding pad areas provided respectively on two lateral sides of the first signal pad area and the second signal pad area and constituting a portion of a coplanar waveguide.

14. The two-end driving, high-frequency transmission structure of claim 13, wherein the base comprises a core column provided on the base and vertical to the body, one vertical side of the core column is provided with conductivity as a combining surface for one side of the sub-substrate body to be fixed and combined with as the grounding layer.

15. The two-end driving, high-frequency transmission structure of claim 14, wherein the sub-substrate comprises a gold-plated side layer configured on the side edge of sub-substrate body, wherein the two lateral sides of the gold-plated side layer are connected respectively to the grounding pad area and the grounding layer by an electrical connection.

16. The two-end driving, high-frequency sub-substrate structure of claim 14, wherein the grounding pad areas is formed with at least one via hole extending through the sub-substrate body in order for the via holes to electrically connect the grounding pad area and the grounding layer.

17. The two-end driving, high-frequency transmission structure of claim 13, wherein the sub-substrate comprises a gold-plated side layer configured on the side edge of sub-substrate body, wherein the two lateral sides of the gold-plated side layer are connected respectively to the grounding pad area and the grounding layer by an electrical connection.

18. The two-end driving, high-frequency transmission structure of claim 13, wherein the grounding pad areas is formed with at least one via hole extending through the sub-substrate body in order for the via holes to electrically connect the grounding pad area and the grounding layer.

19. The two-end driving, high-frequency transmission structure of claim 13, wherein the sub-substrate body is a ceramic heat-dissipating substrate.

20. The two-end driving, high-frequency transmission structure of claim 13, wherein the jumper wire is a gold wire ribbon or a gold wire.

* * * * *